United States Patent [19]
Bäckström et al.

[11] Patent Number: 5,321,850
[45] Date of Patent: Jun. 14, 1994

[54] DIVERSITY RADIO RECEIVER AUTOMATIC FREQUENCY CONTROL

[75] Inventors: Tomas O. Bäckström, Kista; Anders B. Sandell, Upplands Väsby; Peter L. Wahlström, Vällingby, all of Sweden

[73] Assignee: Telefonaktiebolaget L M Ericsson, Stockholm, Sweden

[21] Appl. No.: 774,215

[22] Filed: Oct. 9, 1991

[51] Int. Cl.$^5$ .................. H04B 19/02; H04B 7/08
[52] U.S. Cl. .................. 455/139; 455/273; 455/276.1; 375/40; 375/100
[58] Field of Search .............. 455/52.1, 52.3, 255, 455/10, 63, 65, 67.6, 275, 276.1, 277.2, 313, 273; 375/134-139, 40, 100

[56] References Cited

U.S. PATENT DOCUMENTS

| | | |
|---|---|---|
| 4,079,318 | 3/1978 | Kinoshita . |
| 4,186,347 | 1/1980 | Brockman et al. .................. 455/136 |
| 4,519,096 | 5/1985 | Cerny, Jr. . |
| 4,641,141 | 2/1987 | Masak .................. 455/136 |
| 4,710,975 | 12/1987 | Okamoto et al. .................. 455/276.1 |
| 4,752,941 | 6/1988 | Takahara et al. . |
| 4,752,969 | 6/1988 | Rilling .................. 455/273 |
| 4,850,037 | 7/1989 | Bochmann .................. 315/100 |
| 4,888,817 | 12/1989 | Ryu et al. . |
| 4,939,791 | 7/1990 | Bochmann et al. .................. 455/276.1 |
| 4,965,858 | 10/1990 | Naito et al. . |

FOREIGN PATENT DOCUMENTS 9000566-1  2/1990  Sweden .

Primary Examiner—Reinhard J. Eisenzopf
Assistant Examiner—Lisa Charouel
Attorney, Agent, or Firm—Burns, Doane, Swecker & Mathis

[57] ABSTRACT

A radio-frequency receiver employing antenna diversity is provided with a plurality of antennas and a local oscillator. Individual error signals are derived from each of respective ones of signals received from the plurality of antennas. The error signals are thereafter combined in such a way as to arrive at a combined error signal having greater reliability than any one of the individual error signals taken alone. Finally, an automatic frequency control circuit is controlled using the combined error signal. Since the effect of fading on the input signal to the automatic frequency control circuit is reduced, performance of the automatic frequency control circuit is increased and the quality of radio reception is improved.

11 Claims, 2 Drawing Sheets

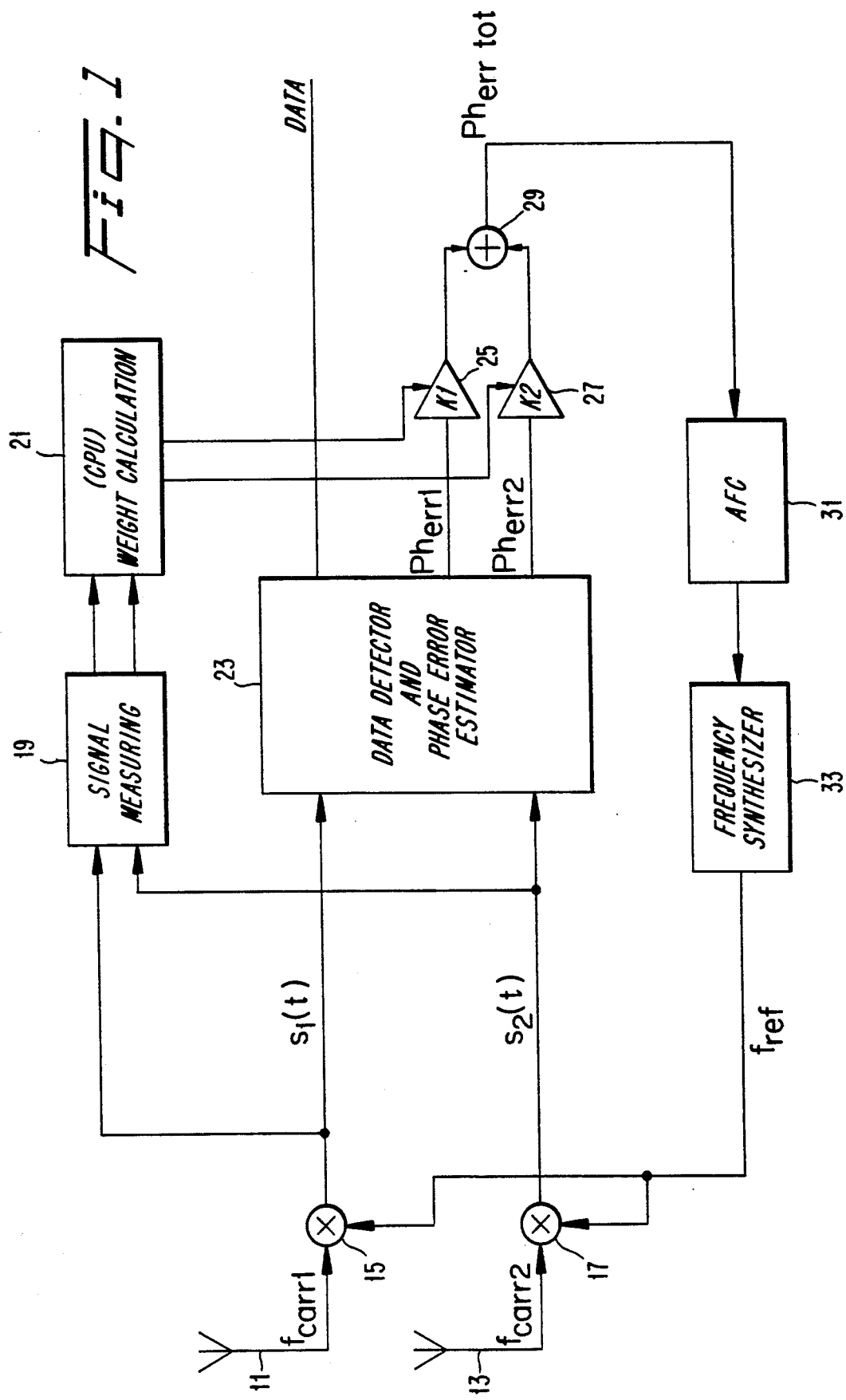

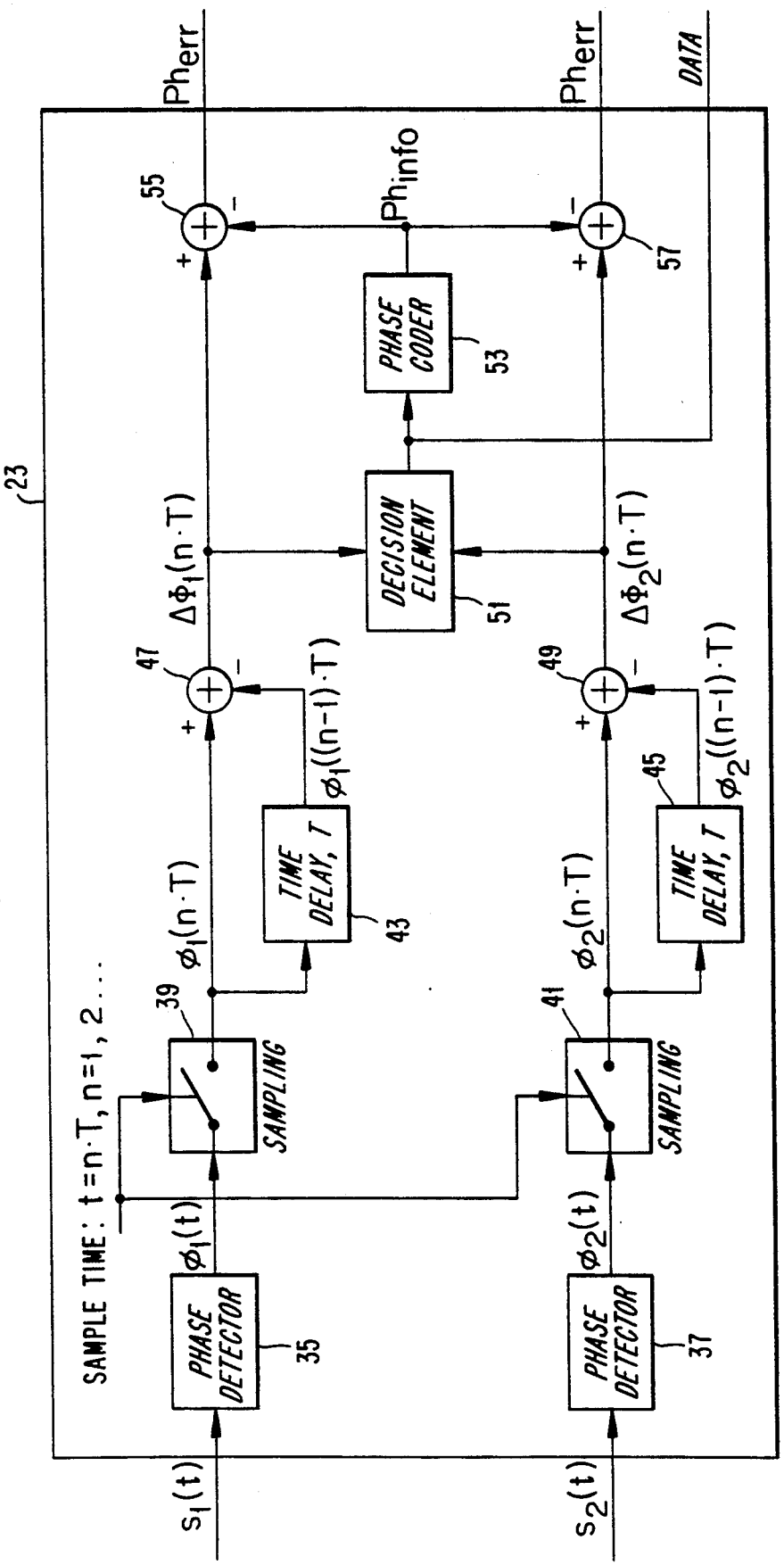

DIVERSITY RADIO RECEIVER AUTOMATIC FREQUENCY CONTROL

BACKGROUND OF THE INVENTION

The present invention relates to radio receivers and more particularly to automatic frequency control in diversity radio receivers.

Automatic frequency control is commonly used in radio receivers to, insofar as possible, keep the radio receiver locked on a frequency desired to be received despite imperfect component stability that would otherwise result in frequency drift. In one known arrangement, for example, a received carrier frequency is mixed with a local replica of the carrier frequency produced by a local oscillator to yield a baseband signal. The frequency error of the baseband signal is measured and the error signal is used to adjust the frequency in the local oscillator to more closely coincide with the actual carrier frequency, resulting in better reception.

Since radio communications exhibit a well-known fading channel characteristic, when fading is severe, it becomes difficult to obtain a reliable error signal in order to adjust the frequency of the local oscillator using an automatic frequency control circuit. Perversely, effective automatic frequency control is most needed during such fading in order to improve reception quality.

Space diversity whereby reception is effected using a plurality of spaced-apart antennas is known to reduce the effects of fading. No application has been made, however, of space diversity to automatic frequency control.

What is needed then, is an automatic frequency control arrangement that is more effective in the presence of fading.

SUMMARY OF THE INVENTION

According to the present invention, a radio-frequency receiver employing antenna diversity is provided with a plurality of antennas and a local oscillator. Individual error signals are derived from each of respective ones of signals received from the plurality of antennas. The error signals are thereafter combined in such a way as to arrive at a combined error signal having greater reliability than any one of the individual error signals taken alone. Finally, an automatic frequency control circuit is controlled using the combined error signal. Since the effect of fading on the input signal to the automatic frequency control circuit is reduced, performance of the automatic frequency control circuit is increased and the quality of radio reception is improved.

BRIEF DESCRIPTION OF THE DRAWINGS

These and other features and advantages of the invention will be readily apparent to one of ordinary skill in the art from the following written description, read in conjunction with the drawings, in which:

FIG. 1 is a block diagram of the essential portion of a radio receiver with automatic frequency control according to the present invention; and FIG. 2 is a block diagram of the data detector and phase error estimator of FIG. 1.

DETAILED DESCRIPTION OF THE PREFERRED EMBODIMENT

Referring now to FIG. 1, the space diversity receiver of the present invention is illustrated as having two antennas 11 and 13; however, any number of antennas may be used consistent with the principles of the present invention. The radio frequency signal picked up on the first antenna 11 is designated as $f_{carr1}$ and a radio frequency signal picked up by the second antenna 13 is designated as $f_{carr2}$. The respective radio frequency signals are input to mixers 15 and 17. Frequency synthesizer 33, which includes a local oscillator, produces a local replica of the carrier frequency $f_{ref}$ which is also input to each of the mixers 15 and 17. The radio frequency signals and the reference frequency are beat together in the mixers to recover respective baseband information signals $s_1(t)$ and $s_2(t)$. These baseband information signals are used by a data detector and phase error estimator 23 to detect the data originally transmitted and to produce an error signal for use by an automatic frequency control circuit 31. The automatic frequency control circuit 31 controls the reference frequency produced by the frequency synthesizer 33.

For purposes of explaining the principle of the present invention, it will be assumed that transmissions to be received by the receiver of FIG. 1 employ digital angle modulation. In particular, for purposes of illustration, differential phase shift keying will be assumed, although the principles of the present invention are applicable to all kinds of digital modulation.

Since the Earth's atmosphere is a very non-ideal channel medium for radio frequency transmissions, the radio frequency signals $f_{carr1}$ and $f_{carr2}$ and hence the information signals $s_1(t)$ and $s_2(t)$ will be subjected to time-varying phase shifts resulting in phase errors. These phase errors are estimated by the data detector and phase error estimator 23 and output as $Ph_{err1}$ and $Ph_{err2}$. Radio frequency signals are also subject to fading as previously explained. Since one of the information signals $s_1(t)$ and $s_2(t)$ will often be received more clearly than the other of the information signals at a given time, a weighted combination of the corresponding phase error signals $Ph_{err1}$ and $Ph_{err2}$ is formed using respective amplifiers 25 and 27 and a summer 29 to form a weighted sum $Ph_{err.tot}$ of the respective phase error signals for input to the automatic frequency control circuit 31. Appropriate weights for each of the phase error signals are calculated by a processor 21 and input to their respective amplifiers 25 and 27 to set the gains K1 and K2 of the respective amplifiers.

A signal measuring unit 19 performs signal measuring with respect to the information signals $s_1(t)$ and $s_2(t)$ and provides measurement results to the processor 21 for use in determining the weights to be applied to the respective phase error signals. The signal measuring unit 19 may also be a part of the data detector and phase error estimator 23. Different types of signal measuring may be employed. Possible types include measuring signal amplitude, signal energy (proportional to the square of the signal amplitude) and signal quality in terms of a signal-to-noise ratio, for example. Other possible measures of signal quality are a signal-to-interference ratio and a bit error rate, the latter utilizing detected data. The signal measuring unit 19 essentially quantifies how well each of the information signals $s_1(t)$ and $s_2(t)$ is received, i.e., it measures the reliability of each of the information signals received. How well the information signal is received will determine how much weight that signal is given for purposes of automatic frequency control. For example, if one of the received information signals is very weak compared to the other due to fading, the strong information signal will dominate control of the automatic frequency control circuit. Thus, a weighted sum is formed by measuring the reliability of information signals received at the antennas and applying a larger weight to the phase error signal representing an information signal having a greater reliability and applying a smaller weight to the phase error signal representing an information signal having lesser reliability.

The data detector and phase error estimator 23 of FIG. 1 is shown in greater detail in FIG. 2, wherein T represents one symbol time in the information stream and is taken as a sampling interval. First, the information signals $s_1(t)$ and $s_2(t)$ containing both amplitude and phase information are input to phase detectors 35 and 37 to produce signals $\phi_1(t)$ and $\phi_2(t)$ containing phase information only with respect to the phase of the reference frequency, $f_{ref}$. At sampling times $t = n \times T$ for $n = 1, 2 \ldots$, the phase signals $\phi_1(t)$ and $\phi_2(t)$ are sampled in respective sampling units 39 and 41 to produce sampled data phase signals $\phi_1(n \times T)$ and $\phi_2(n \times T)$. Previous sampled data phase signals $\phi_1((n-1) \times T)$ and $\phi_2(n-1) \times T)$ are delayed by one sample time T by delay elements 43 and 45 and then subtracted from the present sampled data phase signal $\phi_1(n \times T)$ and $\phi_2(n \times T)$. In differential phase shift keying, the resulting phase differences $\Delta\Phi_1(n \times I)$ and $\Delta\Phi_2(n \times T)$ represent the coded information and are input to a decision element 51. In particular, according to differential phase shift keying, if $-90° < \Delta\Phi < +90°$ then $DATA_n 0$; else if $+90° < \Delta\Phi < +270°$ then $DATA_n = 1$.

The decision element 51 uses the two different phase difference signals to produce a more reliable data output than would result by using only a single phase difference input. A weighted combination of the different phase difference signals may be formed in like manner as the weighted combination of the individual phase error signals in FIG. 1, or a "best one" of the phase difference signals according to measurements performed by the signal measurement unit 19 may be chosen on which to base a decision. If an odd number of antennas are used to produce an odd number of phase difference signals, then the decision element 51 may be such as to form a majority decision. Each of the foregoing alternatives has its relative merits. Other methods of forming a decision may also be suitable. The enumerated alternatives are therefore intended to be exemplary only.

The resulting data decision is encoded in a phase coder 53 to produce what would have been the original phase information $Ph_{info}$. This phase information is subtracted from the respective phase difference signals in summers 55 and 57 to produce the respective phase shift error signals. In accordance with differential phase shift keying, if $DATA_n 32\ 0$ then $Ph_{info} = 0°$ and $Ph_{err} = \Delta\Phi$; else if $DATA_n 1$ then $Ph_{info} = 180°$ and $Ph_{err} \Delta\Phi - 180°$.

The automatic frequency control circuit 31 of FIG. 1 need not be of any particular construction but rather may be of any of the types commonly employed in modern radio frequency receivers. As is the case with any automatic frequency control circuit, the performance of the circuit will be no better than the reliability of the signal driving the automatic frequency control loop. By driving the automatic frequency control loop using a weighted combination of error signals derived from different input signals of a diversity receiver and by calculating appropriate weights according to how well the different signals are received, a more reliable signal is produced to drive the automatic frequency control loop. Especially during fading when automatic frequency control is most needed, performance of the automatic frequency controller may be improved.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. In a radio-frequency receiver employing antenna diversity and having a plurality of antennas and a local oscillator, a method of automatic frequency control, comprising the steps of:

estimating phase errors in respective ones of signal received at respective ones of said plurality of antennas;

forming a weighted sum of said phase errors by arriving at a measure of reliability of each of said signals and applying a larger weight to one of said phase errors representing one of said signals having greater reliability and applying a smaller weight to one of said phase errors representing one of said signals having lesser reliability wherein said weighted sum has a greater reliability than any individual phase error; and controlling frequency of a signal produced by said local oscillator based on said weighted sum.

2. The method of claim 1, wherein signal strength is used as said measure of reliability.

3. The method of claim 1, wherein signal strength is used as said measure of reliability.

4. The method of claim 1, wherein signal strength is used as said measure of reliability.

5. In a radio-frequency receiver employing antenna diversity and having a plurality of antennas and a local oscillator, a method of automatic frequency control apparatus comprising:

means for estimating phase errors in respective ones of signals received at respective ones of said plurality of antennas;

means for forming a weighted sum of said phase errors comprising means for arriving at a measure of reliability of each of said signals and means for applying a larger weight to one of said phase errors representing one of said signals having greater reliability and applying a smaller weight to one of said phase errors representing one of said signals having lesser reliability wherein said weighted sum has a greater reliability than any individual phase error; and means for controlling frequency of a signal produced by said local oscillator based on said weighted sum.

6. The apparatus of claim 5, wherein said means for arriving at the measure of reliability of each of said signals uses signal strength as said measure of reliability.

7. The apparatus of claim 5, wherein said means for arriving at the measure of reliability of each of said signals uses signal energy as said measure of reliability.

8. The apparatus of claim 5, wherein said means for arriving at the measure of reliability of each of said signals uses signal quality as said measure of reliability.

9. In a radio-frequency receiver employing antenna diversity and having a plurality of antennas and a local oscillator, a method of automatic frequency control, comprising the steps of:
 estimating an error quantity with respect to a signal received from each antenna of said plurality of antennas;
 arriving at a measure of reliability of each said signal received from each antenna of said plurality of antennas;
 forming a weighted sum of said error quantities by applying a larger weight to said error quantity of one of said signals received having greater reliability and applying a smaller weight to said error quantity of one of said signals received having lesser reliability; and
 controlling frequency of a signal produced by said local oscillator based on said weighted sum.

10. A radio-frequency receiver employing automatic frequency control and antenna diversity and having a plurality of antennas and a local oscillator, comprising:
 means for estimating an error quantity with respect to a signal received at each antenna of said plurality of antennas;
 means for arriving at a measure of reliability of each said signal received at each antenna of said plurality of antennas;
 means for forming a weighted sum of said error quantities by applying a larger weight to said error quantity of one of said signals having greater reliability and applying a smaller weight to said error quantity of one of said signals having less reliability; and
 means for controlling a frequency of a signal produced by said local oscillator based on said weighted sum.

11. In a radio-frequency receiver employing antenna diversity and having a plurality of antennas and a local oscillator, a method of reducing an effect of fading of at least one of a plurality of input signals on an automatic frequency control circuit, comprising the steps of:
 deriving individual error signals from the input signals received respectively at each antenna of said plurality of antennas;
 arriving at a measure of reliability of each of said error signals and applying a larger weight to one of said error signals having a greater reliability and applying a smaller weight to one of said error signals having lesser reliability to arrive at a combined error signal having greater reliability than any one of said individual error signals taken alone; and
 controlling a frequency of said automatic frequency control circuit using said combined error signal to reduce the effect of fading of said input signals on said automatic frequency control circuit.

* * * * *

UNITED STATES PATENT AND TRADEMARK OFFICE
CERTIFICATE OF CORRECTION

PATENT NO. : 5,321,850
DATED : June 14, 1994
INVENTOR(S) : Tomas O. BÄCKSTRÖM, et al.

It is certified that error appears in the above-indentified patent and that said Letters Patent is hereby corrected as shown below:

At column 4, line 40, change "strength" to --energy--.

At column 4, line 42, change "strength" to --quality--.

At column 4, line 46, change "a method of" to --an--.

Signed and Sealed this

Twenty-third Day of May, 1995

Attest:

BRUCE LEHMAN

Attesting Officer          Commissioner of Patents and Trademarks